US012756158B2

(12) United States Patent
Cheung et al.

(10) Patent No.: US 12,756,158 B2
(45) Date of Patent: Oct. 6, 2026

(54) BANDWIDTH ENHANCEMENT OF QUANTUM DOT/WELL HYBRID III-V/SILICON MICRO-RING LASERS

(71) Applicant: HEWLETT PACKARD ENTERPRISE DEVELOPMENT LP, Houston, TX (US)

(72) Inventors: Stanley Cheung, Milpitas, CA (US); Di Liang, Santa Barbara, CA (US); Raymond G. Beausoleil, Milpitas, CA (US); Michael Renne Ty Tan, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 1436 days.

(21) Appl. No.: 17/464,591

(22) Filed: Sep. 1, 2021

(65) Prior Publication Data

US 2025/0392101 A1 Dec. 25, 2025

(51) Int. Cl.
*H01S 5/125* (2006.01)
*H01S 5/06* (2006.01)
(Continued)

(52) U.S. Cl.
CPC ............ *H01S 5/125* (2013.01); *H01S 5/0612* (2013.01); *H01S 5/1071* (2013.01); *H01S 5/142* (2013.01);
(Continued)

(58) Field of Classification Search
CPC ......... H01S 5/1071–1075; H01S 5/142; H01S 5/1032
See application file for complete search history.

(56) References Cited

U.S. PATENT DOCUMENTS 4,002,997 A * 1/1977 Thompson ............ H01S 5/1071 372/50.123
5,790,583 A * 8/1998 Ho ......................... B82Y 20/00 385/32

(Continued)

FOREIGN PATENT DOCUMENTS

CN 105305227 A * 2/2016
CN 111711069 A * 9/2020 ........... H01S 5/1071

(Continued)

OTHER PUBLICATIONS

Chu, F. H.; "Simulation of strongly injection-locked semiconductor ring lasers"; Feb. 2, 2016; 142 pages.

(Continued)

*Primary Examiner* — Joshua King
(74) *Attorney, Agent, or Firm* — Sheppard Mullin Richter & Hampton LLP

(57) ABSTRACT

An optical device includes a micro-ring laser having a first cavity and a waveguide having a second cavity. Light emitted by the micro-ring laser can be configured to circulate the first cavity. The second cavity can be defined by a first reflector. The first reflector can be a Distributed Braggs Reflector. The waveguide and the micro-ring laser can be positioned with a distance therebetween that allows at least some of the light emitted by the micro-ring laser to leak into the second cavity from the first cavity. The leaked light can reflect off the first reflector of the waveguide.

15 Claims, 7 Drawing Sheets

(51) Int. Cl.

| | |
|---|---|
| ***H01S 5/10*** | (2021.01) |
| ***H01S 5/14*** | (2006.01) |
| ***H01S 5/34*** | (2006.01) |
| ***H01S 5/40*** | (2006.01) |

(52) U.S. Cl.

CPC .......... *H01S 5/3401* (2013.01); *H01S 5/4006* (2013.01); *H01S 5/101* (2013.01); *H01S 5/1032* (2013.01)

(56) References Cited

U.S. PATENT DOCUMENTS

| | | | | |
|---|---|---|---|---|
| 5,878,070 | A * | 3/1999 | Ho | H01S 5/1075 385/32 |
| 6,819,691 | B2 * | 11/2004 | Fan | B82Y 20/00 372/20 |
| 7,257,283 | B1 * | 8/2007 | Liu | G02B 6/12004 385/24 |
| 9,612,503 | B2 * | 4/2017 | Liang | G02F 1/2257 |
| 9,698,457 | B2 * | 7/2017 | Taylor | G02B 6/4274 |
| 10,992,107 | B2 * | 4/2021 | Zhang | H01S 5/1071 |
| 11,573,178 | B2 * | 2/2023 | Meyer | H01S 5/0262 |
| 2003/0058908 | A1 * | 3/2003 | Griffel | H01S 5/1032 372/43.01 |
| 2004/0136412 | A1 * | 7/2004 | Jones | G02B 6/12004 372/20 |
| 2006/0153268 | A1 * | 7/2006 | Yu | G02B 6/12004 372/94 |
| 2008/0089367 | A1 * | 4/2008 | Srinivasan | G02B 6/4202 372/19 |
| 2012/0002694 | A1 * | 1/2012 | Bowers | H01S 5/14 372/45.01 |
| 2012/0063484 | A1 * | 3/2012 | Goddard | G02B 6/124 264/293 |
| 2012/0281957 | A1 * | 11/2012 | Chamanzar | G02B 6/12007 977/773 |
| 2012/0320939 | A1 * | 12/2012 | Baets | H01S 5/1032 372/45.01 |
| 2014/0133512 | A1 * | 5/2014 | Akiyama | B82Y 20/00 372/50.11 |
| 2015/0010035 | A1 * | 1/2015 | Liang | H01S 3/083 372/94 |
| 2016/0238860 | A1 * | 8/2016 | Liang | H01S 5/026 |
| 2016/0336708 | A1 * | 11/2016 | Liang | H01S 3/0637 |
| 2017/0212368 | A1 * | 7/2017 | Liang | G02F 1/3133 |
| 2017/0331249 | A1 * | 11/2017 | Liang | H01S 5/1032 |
| 2018/0191134 | A1 * | 7/2018 | Osinski | H01S 5/0612 |
| 2018/0261978 | A1 * | 9/2018 | Kurczveil | H01S 5/1032 |
| 2018/0294622 | A1 * | 10/2018 | Kurczveil | H01S 5/1032 |
| 2022/0285907 | A1 * | 9/2022 | Morthier | H01S 5/1071 |
| 2023/0231356 | A1 * | 7/2023 | Pinna | H01S 5/141 372/94 |
| 2024/0039244 | A1 * | 2/2024 | Cheung | H01S 5/125 |

FOREIGN PATENT DOCUMENTS

| | | | | |
|---|---|---|---|---|
| CN | 112310808 | A * | 2/2021 | H01S 5/1071 |
| CN | 112366517 | A * | 2/2021 | H01S 5/0653 |
| DE | 19820166 | A1 * | 11/1999 | H01S 5/026 |
| DE | 102009041891 | A1 * | 3/2011 | H01S 3/06729 |
| EP | 4054031 | A1 * | 9/2022 | H01S 5/125 |
| JP | H10261837 | A * | 9/1998 | |
| WO | WO-2017056474 | A1 * | 4/2017 | H01S 5/026 |
| WO | WO-2020191086 | A1 * | 9/2020 | H01S 5/2036 |

OTHER PUBLICATIONS

Ding, X., et al; "Reflectance bandwidth and efficiency improvement of light-emitting diodes with double-distributed Bragg reflector"; May 2017; 7 pages.

Kang, Y. M., et al; "A microring resonator with an integrated Bragg grating: A compact replacement for a sampled grating distributed Bragg reflector"; Apr. 16, 2010; 10 pages.

Lamponi, M., "Hybrid III-V on silicon lasers for telecommunication applications"; Jan. 1, 2013; 182 pages.

Liu, W., et al; "An integrated parity-time symmetric wavelength-tunable single-mode microring laser"; May 12, 2017; 6 pages.

Zhang, C., et al.; "Hybrid quantum-dot microring laser on silicon"; 2019; 7 pages.

* cited by examiner

200

400

BANDWIDTH ENHANCEMENT OF QUANTUM DOT/WELL HYBRID III-V/SILICON MICRO-RING LASERS

STATEMENT OF GOVERNMENT RIGHTS

This invention was made with Government support under Agreement Number H98230-18-3-0001. The Government has certain rights in the invention.

BACKGROUND

Optoelectronic communication (e.g., using optical signals to transmit electronic data) is becoming more prevalent as a potential solution, at least in part, to the ever increasing demand for high bandwidth, high quality, and low power consumption data transfer in various applications. It is contemplated that optoelectronic communication may potentially rewrite current landscape of high performance computing systems, large capacity data storage servers, memory devices, network devices, etc.

Today, micro-ring lasers are considered as alternatives to conventional straight-line lasers for optoelectronic communication. Micro-ring lasers can offer numerous advantages over conventional lasers. For example, micro-ring lasers can have a more compact form factor (ranging around 5-15 micrometers) relative to conventional lasers. Further, micro-ring lasers can exhibit lower capacitance and better parasitic than conventional lasers. However, despite the numerous advantages, existing micro-ring lasers have thus far been limited by their inherent bandwidth characteristics in optoelectronic communications.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
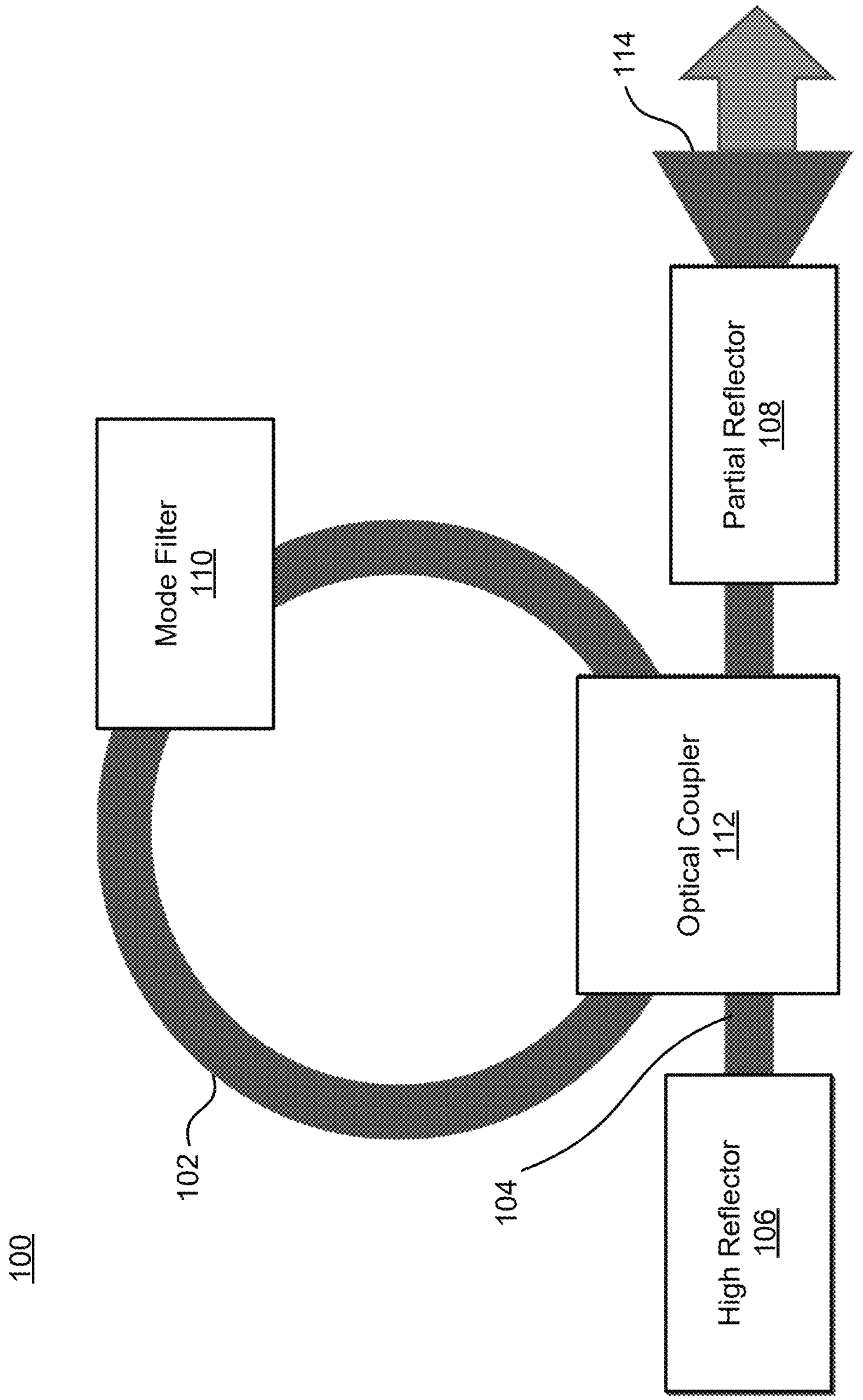
FIG. 1 is a diagram illustrating a top view of an optical device comprising a micro-ring laser having a first cavity and a bus waveguide having a second cavity, according to one example embodiment.

The figures are not exhaustive and do not limit the present disclosure to the precise form disclosed.

DETAILED DESCRIPTION

Micro-ring lasers are miniature optical devices with potential applications in optoelectronics, photonics, and all-optical circuits. A micro-ring laser comprises a ring-shaped optical waveguide ("ring") with a lasing medium. The ring of a micro-ring laser can lase light from within the ring or can receive lased light from external sources. The newly lased or received light can interfere with the trapped light that had been recirculating within the ring. When the newly lased or received light has a select few resonant wavelengths that is a multiple of a circumference of the ring, light within the ring can build up in intensity over time via constructive interference.

Typically, a bus waveguide can be positioned proximate to the ring such that at least some of the light recirculating within the ring can leak out onto the bus waveguide. Then the bus waveguide can provide at least some of the leaked light to a photodetector as an output. The output can be used in optoelectronic communications. For example, the photodetector can detect a "1" when the bus waveguide provides light having an intensity over a certain threshold to the photodetector. Conversely, in the absence of the light having the intensity over the certain threshold, the photodetector can detect a "0".

In many instances, it is desirable to increase communication bandwidth ("bandwidth") of optoelectronic communications by multiplexing multiple wavelengths of light. For instance, wavelength division multiplexing (WDM) is a known technique useful for increasing bandwidth by combining and sending multiple different data channels or wavelengths from one or more optical sources over one optical medium. However, the micro-ring laser is inherently associated with a select few resonant wavelengths (e.g., multiples of the circumference of the ring) and can provide little to no output when light having wavelengths other than the select few resonant wavelengths are concerned. This is because the ring cannot meaningfully trap light having wavelengths other than the select few resonant wavelengths and, when no light is built up in intensity from such trapping, the micro-ring laser is not able to leak a meaningful amount of light to the bus waveguide. For the other wavelengths, the micro-ring laser acts as a filter and may not be an optimal device for optoelectronic communications. Having output limited to certain wavelengths can limit the usefulness of WDM and, thus far, has limited available bandwidth for conventional micro-ring lasers. Further, resistance and capacitance of the conventional micro-ring lasers can introduce modulation delays (referred as RC-bandwidth limitation) and further limit possible bandwidth.

Improved micro-ring lasers disclosed herein address the limited bandwidth problem that plagues conventional micro-ring lasers in general. The improved micro-ring lasers herein can generate one or more modulation side-bands having wavelengths different from the select few resonant wavelengths associated with the ring. Via the one or more modulation side-bands, the improved micro-ring lasers can provide additional wavelengths that can be used in optoelectronic communications. The improved micro-ring lasers can bypass the RC-bandwidth limitation of the conventional micro-ring lasers. The improved micro-ring lasers are described in greater detail below with references to FIGS. 1-6B.

FIG. 1 is a diagram illustrating a top view (e.g., a bird's eye view) of an optical device 100 comprising a micro-ring laser 102 having a first cavity and a bus waveguide 104 having a second cavity, according to one example embodiment. The micro-ring laser 102 can be, for instance, a hybrid silicon micro-ring laser. The hybrid silicon micro-ring laser can comprise a III-V ring resonator on top of a silicon disk with the same or similar diameter. The bus waveguide 104 can be made of Silicon-on-Insulator (SOI) compositions. The hybrid silicon micro-ring laser can include of multi-layer InAs/GaAs quantum dots or quantum wells and can be shaped like a ring (as shown) or a disc (not shown). It is contemplated that other types of materials and compositions are available in constructing the micro-ring laser 102. For a more complete description of material composition of micro-ring lasers that the micro-ring lasers disclosed herein can be composed of, please refer to Liang, D., Huang, X., Kurczveil, G. et al., "Integrated finely tunable microring laser on silicon", Nature Photon 10, 719-722 (2016) and Di Liang, Sudharsanan Srinivasan, Antoine Descos, Chong Zhang, Geza Kurczveil, Zhihong Huang, and Raymond Beausoleil, "High-performance quantum-dot distributed feedback laser on silicon for high-speed modulations," Optica 8, 591-593 (2021) which is incorporated herein in its entirety by reference.

A cavity can be an arrangement of mirrors (or reflective materials) that helps form a standing wave within itself. In other words, a cavity is formed by and between the mirrors (or reflective materials). In the optical device 100, the micro-ring laser 102 can have the first cavity formed within itself. In some instances, the first cavity can include wavelength selective elements and/or elements that break symmetry or bi-stability. Further, the first cavity can include a Metal-Oxide-Semiconductor (MOS) structure for frequency dithering. The bus waveguide 104 can have the second cavity formed within itself. In some embodiments, the second cavity is formed within itself by a high reflector (e.g., a first reflector) 106 and a partial reflector (e.g., a second reflector) 108. In other words, the second cavity can be defined by the bus waveguide 104, the high reflector 106, and/or the partial reflector 108.

The high reflector 106 can be a reflector having a relatively high reflectivity in comparison to the partial reflector 108. In some embodiments, the high reflector 106 can be a Distributed-Bragg-Reflector (DBR) or a metal mirror. The high reflector 106 can be designed to reflect all (or substantially all) of the light reaching the high reflector 106. The partial reflector 108 can allow pass through of at least some of the light reaching the partial reflector 108 to a terminal 114 on an opposing end of the partial reflector 108. The second partial reflector 108 can be a partial reflector DBR. The light reaching the terminal 114 can be considered an output of the optical device 100. The output can provide a modulated data signal used in optoelectronic communication. For example, turning the micro-ring laser 102 on and off can cause the output to be modulated. A photodetector can detect the output.

Each of the first cavity and the second cavity can be associated with multiple (one or more, two or more, etc.) respective cavity modes. For instance, the first cavity can be associated with multiple cavity modes that are multiples of wavelengths that the first cavity allows the ring of the micro-ring laser 102 to build up. In other words, the cavity modes relate to intrinsic wavelengths with which the micro-ring laser 102 exhibits high-feedback and low-loss. The second cavity can also be associated with multiple cavity modes that are multiples of wavelengths that the second cavity allows based on reflections between the high reflector 106 and the second reflector 108.

The first cavity of the micro-ring laser 102 and the second cavity of the bus waveguide 104 can be coupled via an optical coupler 112. The optical coupling can be based on evanescent coupling. The optical coupler 112 can be a tunable coupler which may be a directional coupler and/or a multimode interference (MMI) coupler. The optical coupler 112 can be tunable either by MOS effect(s) or thermal tuning. The optical coupler 112 can be, for example, a grating coupler. In other examples, the optical coupler 112 can include, but is not limited to a: prism, collimating lens, light-turn lens, parabolic reflector, spot-size converter, inversely tapered waveguide, bent waveguide, or a combination of any of the above.

In the optical device 100, the micro-ring laser 102 and the bus waveguide 104 (e.g., the first cavity and the second cavity) can be "self-injection locked." In contrast to external-injection locked micro-ring lasers which provide light from external source(s) (e.g., a primary or injection source) to the micro-ring structure as a secondary or locked source, the micro-ring laser 102 can emit light that recirculates the micro-ring structure and leaks in to the bus waveguide 104. The leaked light can reflect off the high reflector 106 and (i) re-enter the micro-ring structure or (ii) reach the partial reflector 108. The light reaching the partial reflector 108 can be (i) reflected back or (ii) exit out the terminal 114. Some of the wavelengths of light that are reflected back from the partial reflector 108 may also re-enter the micro-ring structure (e.g., directly or be reflected back off the high reflector 106 and re-enter the micro-ring structure). Thus, in the optical device 100, the micro-ring laser 102 can itself be a source (e.g., primary) of light that self-injects emitted light via use of the bus waveguide 104, the high reflector 106, partial reflector 108, and the optical coupler 112 without an additional external source. Accordingly, the optical device 100 can be a self-injection locked device.

The micro-ring structure can comprise a mode filter 110 configured to filter light based on the one or more modes of the light and allow light of other modes to transmit through. The mode filter 110 can allow light that recirculates within the micro-ring structure and exits out the terminal 114 to have only desirable or selectable wavelengths (e.g., frequencies) as controlled by the mode filter 110. As will be described further with respect to FIGS. 2-4, the optical device 100 can, with use of the high reflector 106 and the partial reflector 108 of the second cavity, enhance modulation side-band characteristics of the light emitted by the micro-ring laser 102.

The embodiment illustrated in FIG. 1 shows the micro-ring laser 102 having its circumference in the same plane (e.g., planar orientation) as the bus waveguide 104. However, other configurations of the micro-ring laser 102 in relation to the bus waveguide 104 are possible. For instance, the micro-ring laser 102 can be oriented such that its circumference lies along an axis that goes into and out of the plane of FIG. 1 (e.g., in a plane perpendicular in relation to a plane the bus waveguide 104 extends upon). The micro-ring laser 102 can be oriented with any angle between 0 degrees (e.g., planar) and 90 degrees (e.g., perpendicular) in relation to the bus waveguide 104.

Figure 2:
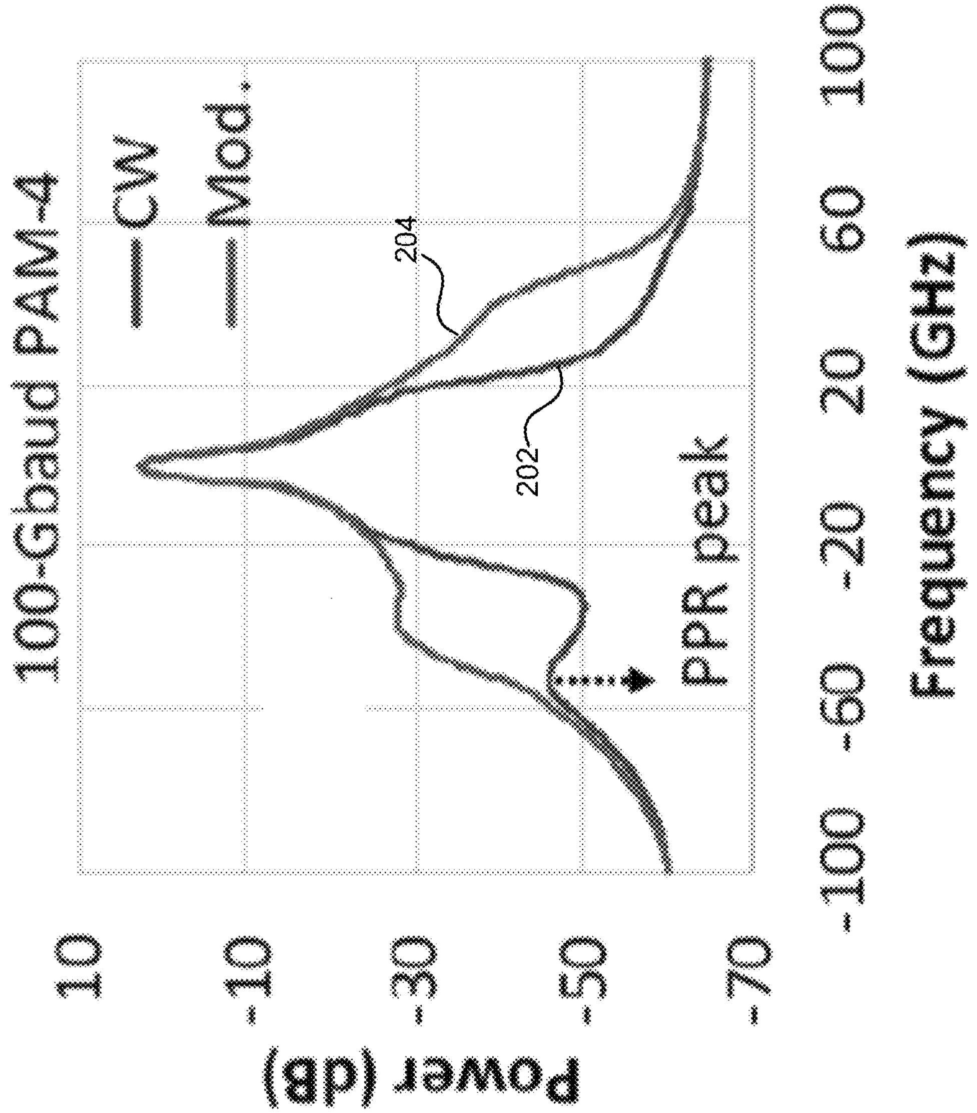
FIG. 2 is a chart illustrating frequency responses of a laser operating at continuous wave (CW) mode and modulated mode, according to one example embodiment.

FIG. 2 is a chart 200 illustrating frequency responses of a laser operating at continuous wave (CW) mode and modulated mode, according to one example embodiment. The chart 200 is based on Yasuhiro Matsui, "Directly-modulated lasers for 100-Gbaud Nyquist PAM4 transmission (Conference Presentation)", Proc. SPIE 11301, Novel In-Plane Semiconductor Lasers XIX, 113010R (9 Mar. 2020) available at https://doi.org/10.1117/12.2548190. The laser can be modulated with an electrical bias or heat. For example, injection of high current may cause the laser to lase while injection of low current (or no current) may stop the laser from lasing. When this particular laser operates in CW, the laser exhibits a first profile 202 that has a low energy level between, for instance, 20 GHz and 60 GHz, thus leaving frequencies between 0 GHz and 10 GHz as the acceptable frequencies for optoelectronic communication. However, when the laser is operating with modulation, the laser exhibits a second profile 204 that has a higher energy level where there used to be low energy level during CW. For instance, the second profile 204 provides higher energy level between 20 GHz and 60 GHz. As shown, modulation can cause the laser to provide energy levels in modulation side-bands (e.g., between 20 GHz and 60 GHz). If the energy levels in the modulation side-bands can be further enhanced, then it could be possible to use frequencies and wavelengths in the modulation side-bands for optoelectronic communication. In other words, enhancing the energy levels in the modulation side-bands can expand bandwidth of a laser available for optoelectronic communication. Schemes for enhancing energy levels in the modulation side-bands are described in greater detail with respect to FIG. 3.

Figure 3:
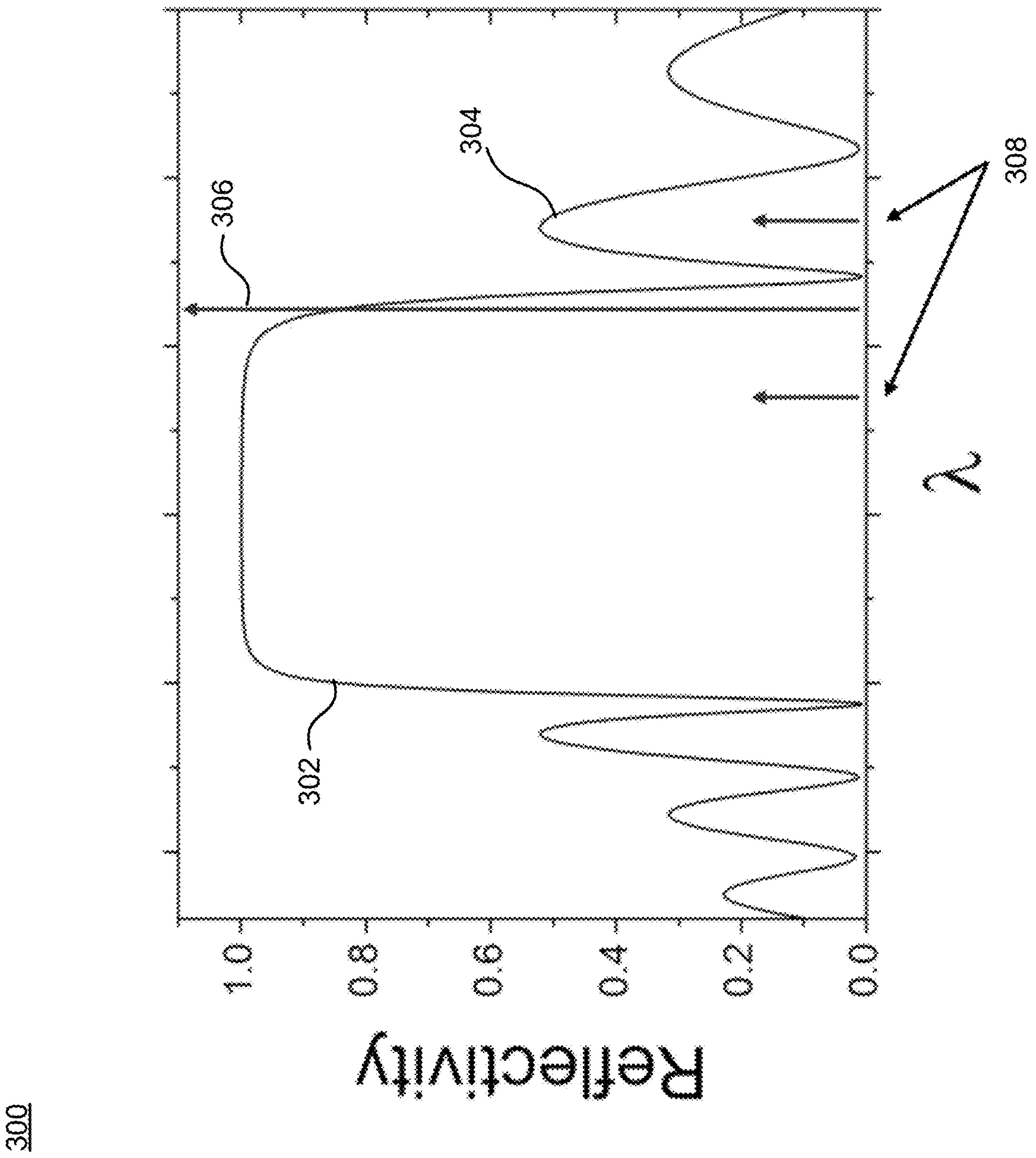
FIG. 3 is a chart overlaying modulation side-bands generated by an optical device with side-modes of a Distributed-Bragg-Reflector (DBR), according to one example embodiment.

FIG. 3 is a chart 300 overlaying modulation side-bands 308 generated by an optical device (e.g., the optical device 100 of FIG. 1) with side-modes of a DBR, according to one example embodiment. As described above, the high reflector 106 and the partial reflector 108 of the second cavity can be DBRs. A DBR, when used in a waveguide, is characterized by a structure that results in periodic variation in the effective refractive index in the waveguide. A DBR allows light having select wavelengths to experience constructive interference and, for the select wavelengths, can act as a high-quality reflector that reflects all or substantially all of the light. For wavelengths that are between the select wavelengths, the DBR does not reflect the wavelengths.

The chart 300 illustrates a DBR that exhibits a typical wavelength-reflectivity profile 302 of a DBR. As the profile 302 depicts, a DBR can provide high reflectivity for select wavelengths and low reflectivity for other wavelengths. Specifically, a DBR of the chart 300 can provide high reflectivity for wavelength(s) that correspond to a side-mode peak 304. It is contemplated that a micro-ring laser (e.g., the micro-ring laser 102 of FIG. 1) can be controlled such that the micro-ring laser emits light having a wavelength that corresponds to a side-mode (e.g., the side-mode peak 304) of the DBR. Further, cavity modes of the micro-ring laser and a bus waveguide can be configured in relation to the DBR such that the light reflected off the DBR can be resonantly amplified in an optical device (e.g., the optical device 100 of FIG. 1) based on Photon-Photon Resonance (PPR) phenomenon.

The chart 300 illustrates energy levels associated with a laser mode 306 and modulation side-bands 308. A laser operating in a continuous wave (CW) emits light having high energy at the laser mode 306 but low energy at the modulation side-bands 308. However, when the laser is modulated, the modulation results in meaningful energy levels at modulation side-bands 308. This is consistent with 20-60 GHz region of the frequency response chart 200 of FIG. 2 with respect to the first profile 202 showing a CW and the second profile 204 showing a modulated laser.

When at least one of the modulation side-bands 308 of a modulated laser correspond to a side-mode peak 304 of a DBR, the DBR can resonantly amplify the energy levels. An optical device (e.g., the optical device 100 of FIG. 1) can utilize the amplified energy levels in DBR side-modes to enhance bandwidth of optoelectronic communication of the micro-ring laser. Experimentally, the optical device is shown to be capable of enhancing bandwidth by 2×-3× but greater enhancement may be achievable.

Figure 4:
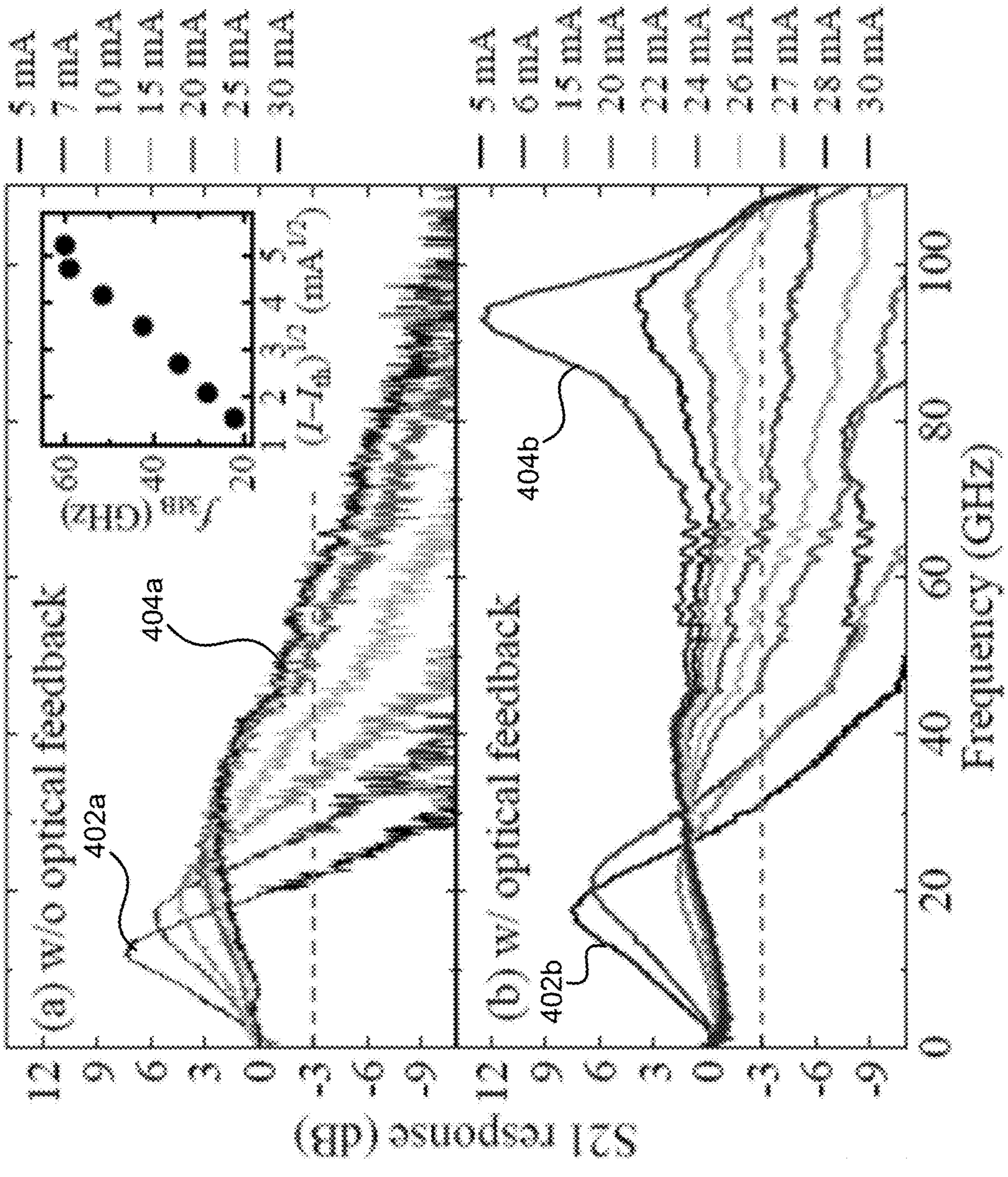
FIG. 4 is a chart of frequency responses of an optical device without and with optical feedback provided by a DBR, according example embodiments.

FIG. 4 is a chart 400 of frequency responses of an optical device without and with optical feedback (e.g., reflection) provided by a DBR, according to example embodiments. The chart 400 is based on Yasuhiro Matsui, "Directly-modulated lasers for 100-Gbaud Nyquist PAM4 transmission (Conference Presentation)", Proc. SPIE 11301, Novel In-Plane Semiconductor Lasers XIX, 113010R (9 Mar. 2020) available at https://doi.org/10.1117/12.2548190. The top chart illustrates frequency responses of the optical device without optical feedback of the DBR. Thus, the top chart is of a conventional micro-ring laser. The bottom chart illustrates frequency responses of the optical device with optical feedback of a DBR. Thus, the bottom chart can be illustrative of the benefits of the optical device 100 of FIG. 1. Both frequency response plots show power levels that correspond to modulations using different levels of current.

Comparisons of the plots without and with optical feedback provided by a DBR are illustrative of the benefits of the optical device. For example, 5 mA modulation frequency response **402*a* without optical feedback of a DBR illustrates that output quickly becomes too weak to use (e.g., at or below −3 dB in signal strength) around 20 GHz. In contrast, 5 mA modulation frequency response 402*b*** with optical feedback of the DBR illustrates that output remains strong (e.g., approximately at 7.5 dB in signal strength) around 20 GHz.

Depending on a current that modulates a laser of the optical device disclosed herein, the optical device can provide a signal that remains strong well into 100 GHz with optical feedback. For example, 30 mA modulation frequency response **404*a* without optical feedback of a DBR illustrates that output quickly becomes too weak to use (e.g., at or below −3 dB in signal strength) around 60 GHz. In contrast, 30 mA modulation frequency response 404*b*** with optical feedback of the DBR illustrates that output remains strong (e.g., approximately at 12.5 dB in signal strength) even around 95 GHz. Thus, the optical device as disclosed herein can enhance bandwidth over conventional lasers.

Figure 5:
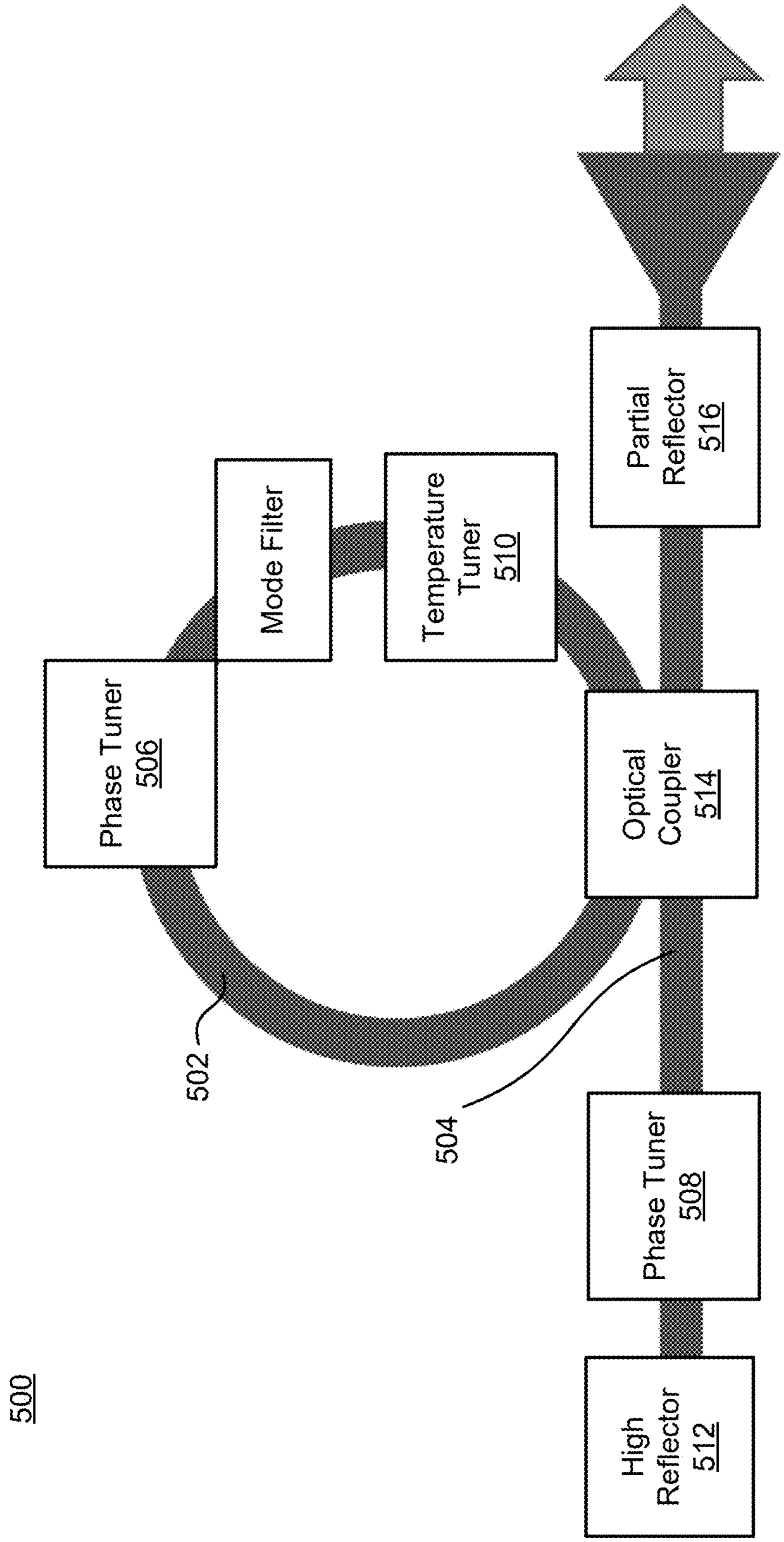
FIG. 5 is a top view of an optical device additionally comprising at least one tuner, according to one example embodiment.

FIG. 5 is a top view (e.g., a bird's eye view) of an optical device 500 additionally comprising at least one tuner, according to one example embodiment. Like the optical device 100 of FIG. 1, the optical device 500 can comprise a micro-ring laser 502 and a bus waveguide 504. The optical device 500 can additionally comprise one or more tuners. The tuner can be phase tuner(s), temperature tuner(s), or other types of tuner(s).

The optical device 500 illustrated comprises a first phase tuner 506 and a second phase tuner 508. The first phase tuner 506 can be configured to tune (or adjust) a phase of light generated or recirculating within the micro-ring laser 502. The second phase tuner 508 can be configured to tune (or adjust) a phase of light leaked into the bus waveguide 504 or reflected off a high reflector 512. The phase tuner(s) 506, 508 can adjust wavelengths of modulation side-bands generated from modulated light. For example, the phase tuner(s) 506, 508 can adjust positioning of the modulation side-bands 308 (illustrated in FIG. 3) along the X-axis (wavelength axis) so that at least one of the modulation side-bands 308 correspond to a DBR side-mode peak 304. The optical device 500 may include fewer or additional phase tuners.

The optical device 500 may comprise a temperature tuner 510. The temperature tuner 510 can be a thermal heater, a thermal cooler, or both. While the temperature tuner 510 illustrated is positioned on (or integrated within) the micro-ring laser 502, it may be positioned on (or integrated within) the bus waveguide 504. By controlling temperature of the micro-ring laser 502 or the bus waveguide 504, the temperature tuner 510 can align cavity modes of a first cavity of the micro-ring laser 502 and a second cavity of the bus waveguide 504. In some embodiments, the temperature tuner 510 can phase-tune the second cavity to align the second cavity with the first cavity. In some embodiments, laser mode alignment can be accomplished by current injection into the micro-ring structure or heating the substrate.

As described with respect to FIG. 1, a high reflector 512 of the optical device 500 can be a DBR. In some embodiments, the high reflector 512 can be a loop mirror or a tunable loop mirror. An optical coupler 514 can be a tunable directional coupler that allows only light travelling in a certain direction to leak into or out of the micro-ring laser 502. The coupling between a first cavity of the micro-ring laser 502 and a second cavity of the bus waveguide 504 can be controlled by the tunable directional coupler. In some embodiments, the optical coupler 514 can comprise a Mach-Zehnder Interferometer (MZI) that is configured to determine relative phase shift variations between light generated or recirculating in the micro-ring laser 502 and travelling to or reflected from the bus waveguide 504.

In some embodiments, a partial reflector 516 of the optical device 500 can be a grating coupler with finite reflection. For the phase tuners 506, 508, temperature tuner 510, high reflector 512, optical coupler 514, and partial reflector 516, many different compositions of different materials that satisfy functions described above are contemplated.

Figure 6A:
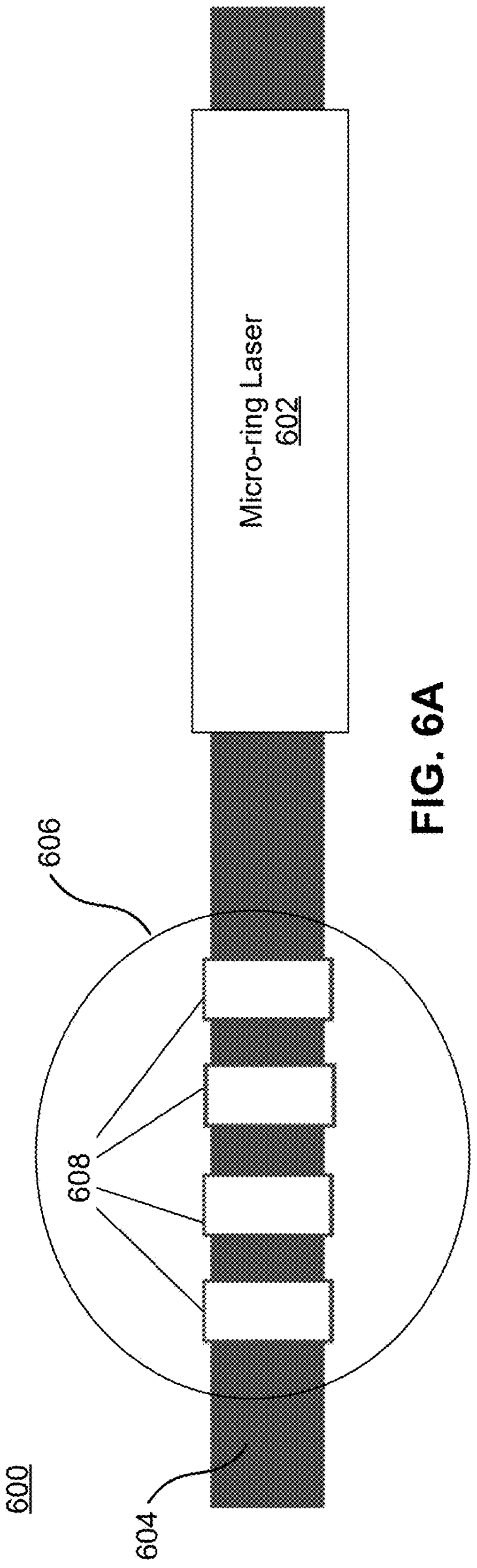
FIGS. 6A-6B are side views of an optical device comprising a DBR, according to example embodiments.
Figure 6B:
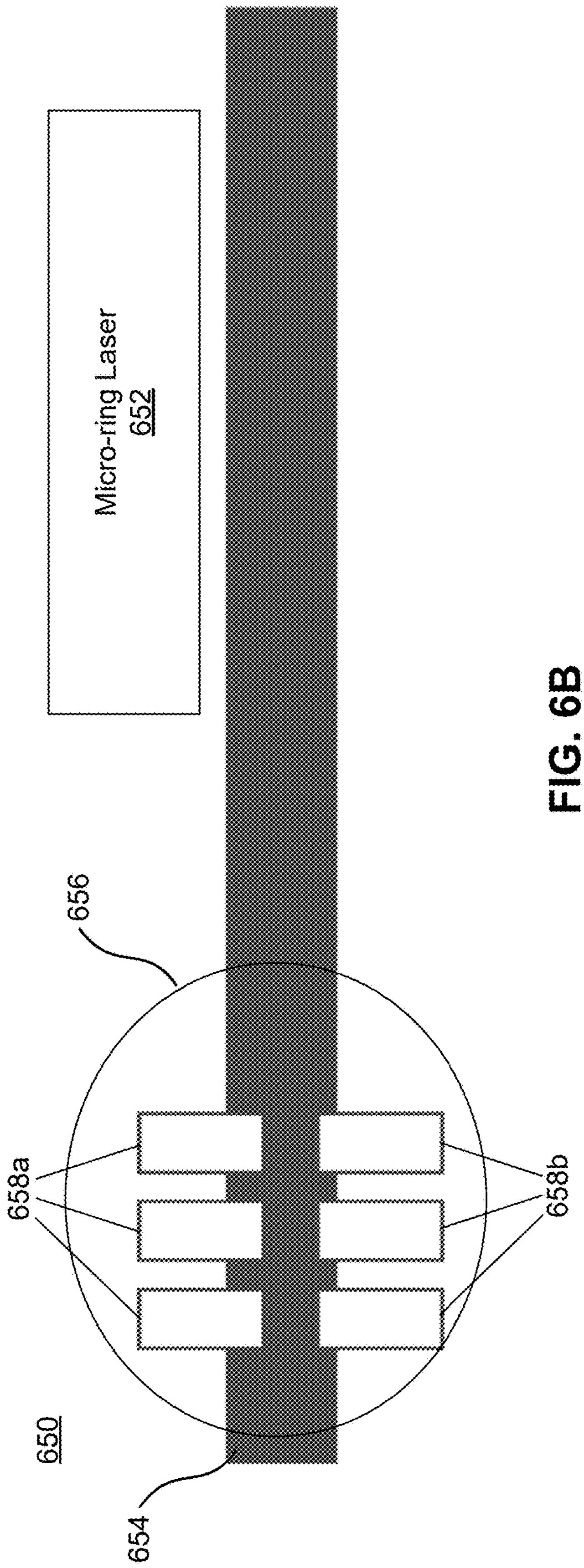

FIGS. 6A-6B are side views 600, 650 of an optical device comprising a DBR, according to example embodiments. FIG. 6A illustrates a side view 600 in which a micro-ring laser 602 is vertically coupled to (positioned directly over) a bus waveguide 604 toward a viewer. The side view 600 illustrates a DBR 606 (e.g., the high reflector 106 of FIG. 1 or 512 of FIG. 5). The DBR 606 can be defined with corrugations 608 that are positioned on the side of the micro-ring laser 602 on the bus waveguide 604. In some embodiments, the corrugations can be positioned on the side opposite the side of the micro-ring laser 602 (i.e., the side away from the viewer and below the bus waveguide 604). The side view 600 illustrates surface grating on the bus waveguide 604 approach. Generally, the surface grating is a widely used approach, but can require a separate lithography and etch process to manufacture. In some embodiments, the corrugations can be positioned on both sides of the bus waveguide 604. Many variations are possible.

FIG. 6B illustrates a side view 650 in which a micro-ring laser 652 is laterally coupled to (positioned side-by-side) a bus waveguide 654. The side view 650 illustrates a DBR 656 (e.g., the high reflector 106 of FIG. 1 or 512 of FIG. 5). The DBR 656 can be defined with two sets of corrugations 658*a*, 658*b* that are positioned on either or both sides of the bus waveguide 654. In some embodiments, corrugations can be placed on only one side of the bus waveguide 654 (e.g., only one set of corrugations 658*a*, 658*b* is positioned instead of both sets of corrugations 658*a*, 658*b*). The side view 650 illustrates sidewall grating on bus waveguide 604 approach. The sidewall grating can be patterned and manufactured along with the bus waveguide 654 and provide a simpler/cheaper manufacturing process. Many variations are possible.

In some embodiments, the corrugations 608, 658*a*, 658*b* can be etched on the bus waveguides 604, 654. The corrugations 608, 658*a*, 658*b* can form a structure from multiple layers of alternating materials with varying refractive index, or by periodic variation of some characteristic (such as height), resulting in periodic variation in the effective refractive index.

Figure 7:
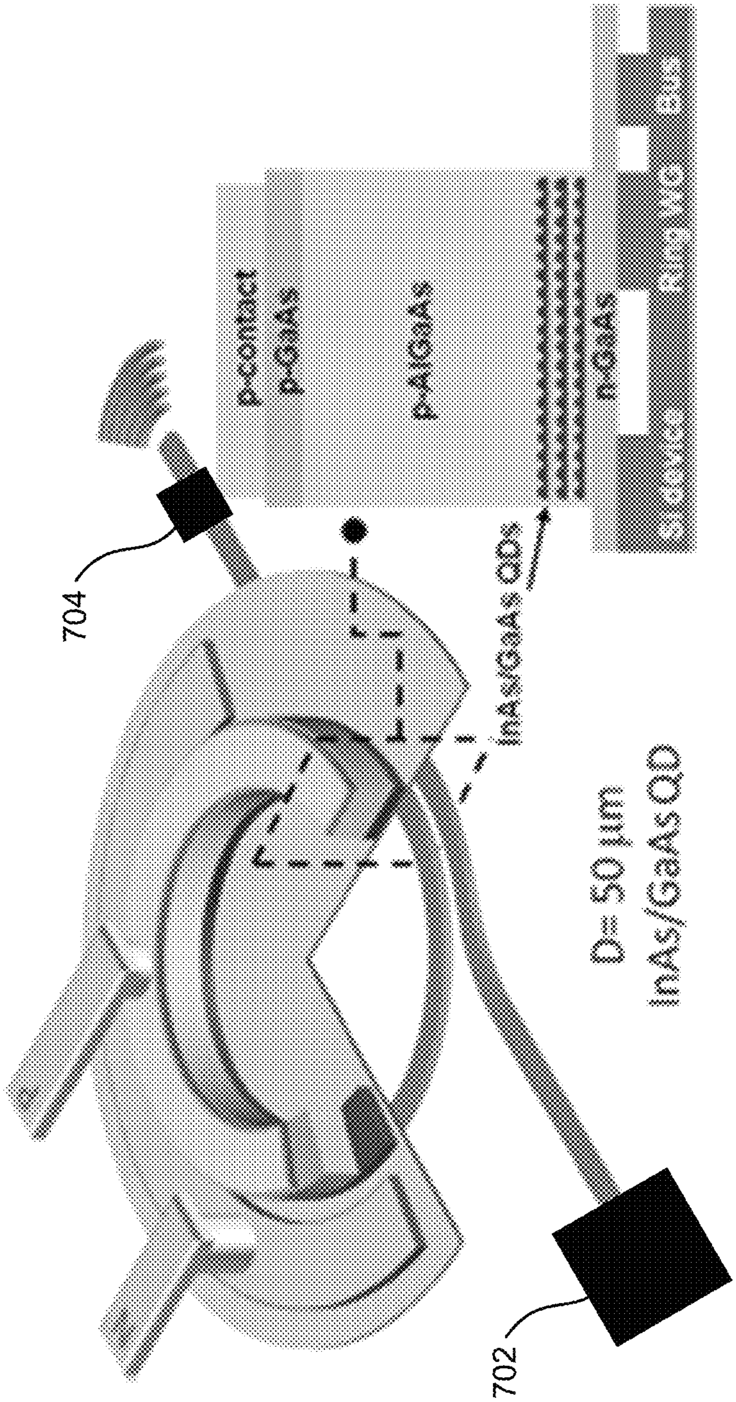
FIG. 7 is a perspective view of an optical device, according to one example embodiment.

FIG. 7 is a perspective view 700 of an optical device (e.g., the optical device 100 of FIG. 1 or the optical device 500 of FIG. 5), according to one example embodiment. The perspective view 700 illustrates example composition of the optical device with a high reflector 702 (e.g., the high reflector 106 of FIG. 1 or 512 of FIG. 5) and a partial reflector 704 (e.g., the partial reflector 108 of FIG. 1 or 516 of FIG. 5). Other compositions are also contemplated and many variations are possible.

In summary, the optical device disclosed herein can increase bandwidth of conventional micro-ring lasers by configuring an associated bus waveguide with a DBR. A first cavity can be formed within a micro-ring laser of the optical device. The DBR can be positioned at one end of the bus waveguide and reflect some of the light that leaks into the bus waveguide back. A second cavity can be formed within the bus waveguide by the DBR and a partial reflector that is on the end of the bus waveguide that opposes the DBR. The DBR can provide side-modes via constructive interference of reflected light. An optical coupling between the first cavity and the second cavity can be aligned using one or more phase tuner(s) and/or temperature tuners. The alignment can be such that modulated light from the micro-ring laser has modulation side-bands matching the side-modes of the DBR. Once aligned, optical energy can be resonantly amplified for the wavelengths that correspond to the modulation side-bands. The amplified optical energy can enhance optoelectronic communication bandwidth by 2×-3× or more.

In common usage, the term "or" should always be construed in the inclusive sense unless the exclusive sense is specifically indicated or logically necessary. The exclusive sense of "or" is specifically indicated when, for example, the term "or" is paired with the term "either," as in "either A or B." As another example, the exclusive sense may also be specifically indicated by appending "exclusive" or "but not both" after the list of items, as in "A or B, exclusively" and "A and B, but not both." Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An optical device, comprising:

a micro-ring laser having a first cavity, wherein light emitted by the micro-ring laser is configured to circulate the first cavity; and a waveguide having a second cavity defined by a first reflector, wherein the waveguide and the micro-ring laser are positioned with a distance therebetween that allows at least some of the light emitted by the microring laser to leak into the second cavity from the first cavity and reflect off the first reflector, wherein the first reflector is a Distributed Braggs Reflector (DBR) that is associated with at least one side-mode peak, and the optical device is tuned to align at least one modulation side-band of the micro-ring laser with the at least one side-mode peak.

2. The optical device of claim 1, further comprising a second reflector, wherein:

the first reflector is positioned at a first side of the waveguide in relation to the micro-ring laser, the second reflector is positioned on a second side of the waveguide, the second side opposite the first side in relation to the micro-ring laser, and the second reflector is associated with a reflectivity that is less than a reflectivity of the first reflector.

3. The optical device of claim 1, wherein the first reflector provides self-injection locking for the optical device.

4. The optical device of claim 1, wherein the first cavity comprises a single mode filter.

5. The optical device of claim 1, further comprising:

a thermal heater configured to adjust temperature of the second cavity, wherein adjustment of the temperature aligns cavity modes of the first cavity and the second cavity.

6. The optical device of claim 1, further comprising:

a tunable coupler between the first cavity and the second cavity.

7. The optical device of claim 6, wherein the tunable coupler is at least one of a directional coupler, multi-mode interference (MMI) coupler, or a vertical coupler.

8. The optical device of claim 6, wherein the tunable coupler is tunable either by metal-oxide-silicon (MOS) effect or thermal tuning.

9. The optical device of claim 1, further comprising:

a phase tuner positioned on the micro-ring laser, wherein the phase tuner is tunable to adjust wavelengths of modulation side-bands of the micro-ring laser.

10. The optical device of claim 2, further comprising:

a phase tuner positioned on the first side of the waveguide, wherein the phase tuner is tunable to adjust wavelengths of modulation side-bands of the micro-ring laser.

11. The optical device of claim 1, wherein a ring of the micro-ring laser and the waveguide are planar on a same plane.

12. The optical device of claim 11, wherein the DBR has corrugations that are on top of the waveguide with respect to the plane.

13. The optical device of claim 11, wherein the DBR has corrugations that are on at least one side of the waveguide, the at least one side perpendicular to the plane.

14. The optical device of claim 1, wherein a ring of the micro-ring laser and the waveguide are not planar on a plane.

15. The optical device of claim 1, wherein the optical device transmits optoelectronic signals having frequencies between 50 GHz to 70 GHz.

* * * * *